(12) United States Patent
Larson et al.

(10) Patent No.: US 8,981,280 B2
(45) Date of Patent: Mar. 17, 2015

(54) OPTICAL INTERRUPTION SENSOR WITH OPPOSED LIGHT EMITTING DIODES

(75) Inventors: Eric K. Larson, Cumberland, RI (US); Matthew C. Webster, Chepachet, RI (US); Jian Hong Kang, Sharon, MA (US); Matthew J. Grimes, East Bridgewater, MA (US)

(73) Assignee: Illinois Tool Works Inc., Glenview, IL (US)

( * ) Notice: Subject to any disclaimer, the term of this patent is extended or adjusted under 35 U.S.C. 154(b) by 165 days.

(21) Appl. No.: 13/388,505

(22) PCT Filed: Jun. 17, 2010

(86) PCT No.: PCT/US2010/038933
§ 371 (c)(1),
(2), (4) Date: Feb. 2, 2012

(87) PCT Pub. No.: WO2011/016908
PCT Pub. Date: Feb. 10, 2011

(65) Prior Publication Data
US 2012/0138777 A1    Jun. 7, 2012

Related U.S. Application Data

(60) Provisional application No. 61/230,922, filed on Aug. 3, 2009.

(51) Int. Cl.
*H01L 31/167* (2006.01)
*G01J 1/18* (2006.01)
*G01D 5/244* (2006.01)

(52) U.S. Cl.
CPC .............. *H01L 31/167* (2013.01); *G01J 1/18* (2013.01); *G01D 5/2448* (2013.01)
USPC ........................................................ 250/221

(58) Field of Classification Search
CPC .... H01L 31/67; H01L 31/173; H03K 17/941; G01J 1/18; G01J 1/44; G01J 1/4257; G01D 5/2457; G01D 5/24452; G01D 5/2451; G01D 5/2448
USPC ............ 250/221, 222.1, 239, 214 A, 214 SW, 250/231.1, 231.13, 213.14, 232, 233, 250/231.14
See application file for complete search history.

(56) References Cited

U.S. PATENT DOCUMENTS 3,822,384 A * 7/1974 Chapron et al. ............... 250/551
3,906,240 A * 9/1975 Jeffree ...................... 250/223 R
(Continued)

FOREIGN PATENT DOCUMENTS

JP    58155778 A    9/1983
JP    63011888 A    1/1988
(Continued)

OTHER PUBLICATIONS

ISR for PCT/US2010/038933 dated Nov. 15, 2010.

*Primary Examiner* — John Lee

(57) ABSTRACT

An optical-interrupter provides a mechanically integrated electric light source and electric light sensor positioned across a gap to transmit a light beam across the gap that may be interrupted with an opaque vane. The optical-interrupter uses conventional LEDs for both the light source and a light receiver. An integrated circuit comparator may be used to provide an adjustable threshold for the determination of whether the light beam is blocked.

19 Claims, 2 Drawing Sheets

(56) References Cited

U.S. PATENT DOCUMENTS

| | | | |
|---|---|---|---|
| 3,919,546 A * | 11/1975 | Lutus | 250/205 |
| 4,695,720 A * | 9/1987 | Rieder et al. | 250/231.14 |
| 4,856,011 A * | 8/1989 | Shimada et al. | 372/29.01 |
| 4,859,057 A * | 8/1989 | Taylor et al. | 600/473 |
| 5,015,836 A * | 5/1991 | Van Antwerp | 250/205 |
| 5,065,013 A * | 11/1991 | Taylor | 250/231.18 |
| 5,075,543 A * | 12/1991 | Courtney | 250/223 R |
| 5,103,085 A * | 4/1992 | Zimmerman | 250/221 |
| 5,144,286 A * | 9/1992 | Rollins | 340/635 |
| 5,347,386 A * | 9/1994 | Gibbs et al. | 398/111 |
| 5,393,989 A * | 2/1995 | Gempe et al. | 250/551 |
| 5,804,997 A * | 9/1998 | Nishizono et al. | 327/103 |
| 6,150,946 A * | 11/2000 | Focke | 340/675 |
| 6,271,523 B1 * | 8/2001 | Weaver et al. | 250/341.8 |
| 6,291,839 B1 * | 9/2001 | Lester | 257/91 |
| 6,296,148 B1 * | 10/2001 | Myers et al. | 222/71 |
| 6,375,340 B1 * | 4/2002 | Biebl et al. | 362/294 |
| 6,605,804 B1 * | 8/2003 | Muller-Fiedler et al. | 250/227.23 |
| 6,849,845 B2 * | 2/2005 | Lauffenberger et al. | 250/214 SW |
| 6,870,148 B2 * | 3/2005 | Dietz et al. | 250/205 |
| 6,995,360 B2 * | 2/2006 | Jones et al. | 250/269.1 |
| 7,002,771 B2 * | 2/2006 | Christie et al. | 360/77.12 |
| 7,230,687 B2 * | 6/2007 | O'Mahony et al. | 356/39 |
| 7,256,409 B2 * | 8/2007 | Cho | 250/551 |
| 7,265,340 B2 * | 9/2007 | Minamio et al. | 250/239 |
| 7,291,831 B2 * | 11/2007 | Rajaiah et al. | 250/231.13 |
| 7,586,078 B2 * | 9/2009 | Chen | 250/214 SW |
| 7,718,942 B2 * | 5/2010 | Lim et al. | 250/205 |
| 7,816,638 B2 * | 10/2010 | Olson et al. | 250/214.1 |
| 2001/0025917 A1 * | 10/2001 | Asada et al. | 250/221 |
| 2002/0100866 A1 * | 8/2002 | Butka et al. | 250/214 DC |
| 2009/0032295 A1 * | 2/2009 | Okajima et al. | 174/260 |
| 2009/0127446 A1 * | 5/2009 | Ramachandran et al. | 250/231.13 |
| 2010/0102208 A1 * | 4/2010 | Bergmann et al. | 250/214 SW |
| 2012/0138777 A1 * | 6/2012 | Larson et al. | 250/214.1 |

FOREIGN PATENT DOCUMENTS

| | | |
|---|---|---|
| JP | 6181335 A | 6/1994 |
| JP | 7131062 A | 5/1995 |
| JP | 8242018 A | 9/1996 |
| JP | 3043747 B1 | 5/2000 |

* cited by examiner

OPTICAL INTERRUPTION SENSOR WITH OPPOSED LIGHT EMITTING DIODES

CROSS REFERENCE TO RELATED APPLICATION

This application claims the benefit of U.S. provisional application 61/230,922 filed Aug. 3, 2009 and hereby incorporated by reference.

FIELD OF THE INVENTION

The present invention relates to optical sensors and, in particular, to optical interruption sensors that may detect blockage of a beam of light.

BACKGROUND OF THE INVENTION

Optical interruption sensors, or "photo-interrupters", are well known in the art and normally provide an opposed light transmitter, typically a light emitting diode ("LED"), and a light receiver (typically a phototransistor). The light transmitter and receiver may be placed in opposition as supported within a housing. The housing provides windows to permit a beam of light to pass from the light transmitter across a slot to the light receiver.

A light blocking vane, for example, a spoke on a rotating wheel or the like, may move into and out of the slot to block or permit passage of the light beam. In this way, detection of the light beam at the light receiver can be used to detect relative movement of the vane with respect to the housing. When the vane is on a rotating wheel, for example, interruption of the light beam detected at the light receiver provides an indication of rotational speed of the wheel.

The optical-interrupter may include an internal biasing circuit for controlling the brightness of the light transmitter and a detector circuit providing an electrical output (typically a binary signal) indicating whether the light beam is blocked or unblocked based on a pre-established threshold applied to an electrical signal from the light receiver.

SUMMARY OF THE INVENTION

The present invention provides an extremely low cost photo-interrupter in which the light transmitter and light receiver are both light emitting diodes. The use of two LEDs provides lower-cost than an LED and phototransistor pair both because of the economy of scale of purchasing similar parts and because of the lower cost of LEDs with respect to photo transistors.

Specifically, the present invention provides a photosensor-photodetector assembly providing a support defining an unobstructed light path through a gap from a first to a second position, and a solid-state light transmitter and solid-state light receiver attached to the support in the first and second positions so that light from the solid-state light transmitter may be received by the solid-state light receiver. The gap is sized to permit an optical blocking element to pass into and out of the gap to block the light from the solid-state light transmitter to the solid-state light receiver and the solid-state light transmitter and solid-state light receiver are both light emitting diodes.

It is thus a feature of at least one embodiment of the invention to reduce the cost of this standard component to permit its use in a wider variety of products.

The light emitting diodes may be selected to produce light of identical light frequency when operated as light emitters.

It is thus a feature of at least one embodiment of the invention to provide a natural matching between the band gaps of the two devices for improved conversion efficiencies.

The light emitting diodes may, in one embodiment, emit visible red light. Other colors may also be used, including infrared and other visible colors.

It is thus a feature of at least one embodiment of the invention to make use of a common LED type having low cost and high efficiency.

The light emitting diodes may be electrically, optically, and physically identical.

It is thus a feature of at least one embodiment of the invention to permit economies of scale in part purchases and to simplify stocking of parts for manufacture.

The photosensor-photodetector assembly may further include biasing circuitry connected to the solid-state light transmitter to provide a predetermined light output from the solid-state light transmitter. Alternatively or in addition, the photosensor-photodetector assembly may further include detection circuitry connected to the solid-state light receiver providing a two-state output having a first state when the solid-state light receiver receives a first intensity of light provided by unobstructed light from the solid-state light transmitter as biased by the biasing circuitry and having a second state when the solid-state light receiver receives a second intensity of light less than the first intensity of light.

It is thus a feature of at least one embodiment of the invention to simplify the assembly of the device into products.

The detection circuitry may include a comparator and an electrical reference, wherein the comparator receives at one input an electrical signal from the solid-state light receiver having first and second values for the first and second intensities of light the comparator, and receives at another input a reference output value from the electrical reference between the first and second values.

It is thus a feature of at least one embodiment of the invention to permit flexible adjustment of the switching threshold of the device in a way that is internal and invisible to the user and thus that facilitates the use with LEDs having less precisely characterized optical characteristics. A given LED batch may be tested and the threshold set eliminating the need for precisely characterized parts.

The electrical reference and the biasing circuit may provide the predetermined light output and the reference output value, respectively, as a function of a supply voltage to the photosensor-photodetector assembly.

It is thus a feature of at least one embodiment of the invention to permit operation at a variety of operating voltages without precise voltage regulation.

The comparator may be an integrated circuit differential amplifier.

It is thus a feature of at least one embodiment of the invention to use an operational amplifier to provide for well-defined and robust switching from an LED used as a light detector. The present inventors have determined that the cost savings on the detector permit the use of this more sophisticated circuitry.

The comparator provides an open collector output.

It is thus a feature of at least one embodiment of the invention to permit use of an operational amplifier with a single-ended, low voltage power supply appropriate for an optical-interrupter application.

The support may be a flexible printed circuit board held within a housing bending the flexible printed circuit board into a U-shape with the first and second positions located at ends of the U-shape.

It is thus a feature of at least one embodiment of the invention to provide a simple method of incorporating the light transmitter and light receiver together with other circuitry in a low-cost package.

Alternatively, the support may be a rigid planar printed circuit board cut into a U-shape with the first and second positions located at ends of the U-shape.

It is thus a feature of at least one embodiment of the invention to permit the use of low-cost rigid printed circuit board materials.

The light emitting diodes may provide a maximum light emitting direction parallel to a mounting surface of the light emitting diode abutting the support surface.

It is thus a feature of at least one embodiment of the invention to simplify the integration of the LEDs into a rigid printed circuit board material support.

Other features and advantages of the invention will become apparent to those skilled in the art upon review of the following detailed description, claims and drawings in which like numerals are used to designate like features.

DETAILED DESCRIPTION OF THE PREFERRED EMBODIMENTS

Figure 1:
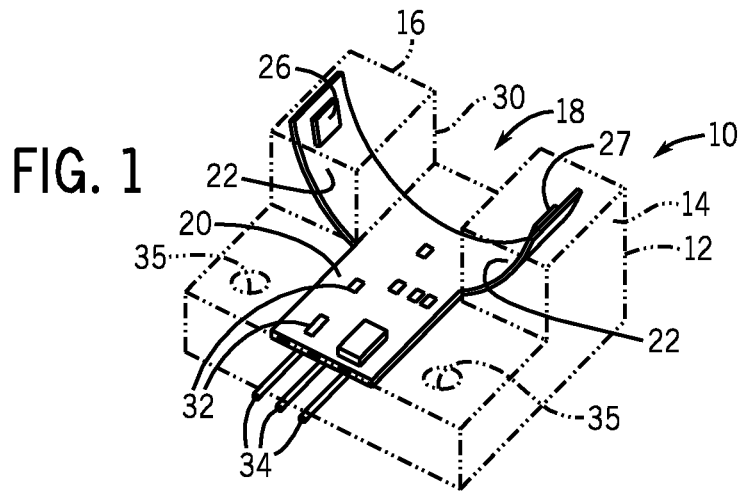
FIG. 1 is a perspective view, in phantom, of a photo-interrupter of the present invention showing attachment of complementary surface mount LEDs to a flexible circuit board within a housing of the photo-interrupter.

Referring now to FIG. 1, an optical-interrupter 10 per the present invention may, in one embodiment, provide a housing 12 having two upwardly extending turrets 14 and 16 opposed across a slot 18. The housing 12 may be constructed at least on part of a transparent thermoplastic material so that light may pass through the opposed facing walls of the turrets 14 and 16.

Inside the housing 12, a flexible printed circuit board 20 having a generally T-shaped outline includes wing portions 22, the center of which may fit beneath the slot 18 with the wing portions 22 bent upward so that ends of the wing portions 22 pass into the turrets 14 and 16 respectively.

These ends of the wing portions 22 may support surface-mount LEDs 26 and 27 respectively on their facing surfaces. Internal structure of the turrets 16 and 14 guides the wing portions 22 so that the LEDs 26 and 27 are aligned in facing configuration opposed across the slot 18 and along optical axis 30. As so positioned, light may pass from LED 26 along the optical axis 30 to be received by LED 27 with an axis of highest intensity light emission from LED 26 aligned with the corresponding axis of LED 27.

Electrical traces of the printed circuit board 20 connect the LEDs 26 and 27 to various components 32 on the surface of the printed circuit board 20 as will be described below. Terminal pins 34 attached to the printed circuit board 20 permit the connection of the optical-interrupter 10 to other devices, for example a home appliance where mechanical motion must be monitored, for example, to determine the rotation of the spin basket in a washing machine. The terminal pins 34 permit electrical communication between the components 32 within the optical-interrupter 10 and corresponding circuitry of the external device. For this purpose, the terminal pins 34 pass through the housing 12 to be received by a connector (not shown) leading to the external device incorporating the optical-interrupter 10.

The housing 12 may include mounting holes 35 or the like for attaching the housing 12 to the device with which the optical-interrupter 10 will be used.

Figure 2:
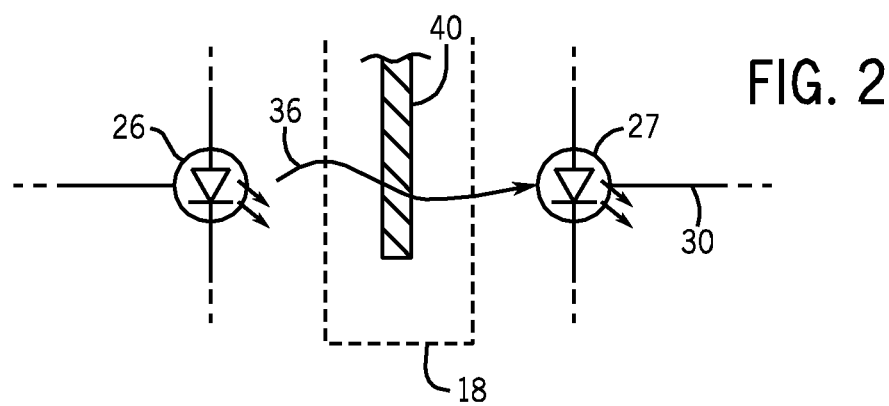
FIG. 2 is a simplified diagram of the transmitter and receiver of the present invention as may detect an interrupting vane.

Referring now to FIG. 2, LED 26 may be configured as a light transmitter, emitting light 36 along axis 30 while LED 27 may be configured as a light receiver, receiving and detecting light 36 along axis 30. A vane 40 may periodically pass into slot 18 across axis 30 to block light 36, and out of slot 18 away from axis 30 to permit passage of the light 36 thereby changing the amount of light received and detected by the LED 27.

Generally, LEDs differ from other photo detectors such as photo diodes and phototransistors by their construction and, often, by the materials used in the LEDs. LEDs may use direct band gap semiconductor materials (as opposed to indirect band gap semiconductor materials) in forming a PN junction. Typically the N-doped material of the PN junction is attached to an opaque support, being either or both of a heatsink or electrical conductor, and light is emitted from the P-doped material. The PN junction is normally encased within a light transparent material such as a plastic that is either clear or tinted to match the color of the emitted light. The support for the PN junction of the LEDs 26 and 27 may be associated with a reflector element.

In this embodiment, the LEDs 26 and 27 are surface mount devices and the emission or reception direction of the LEDs 26 and 27 along optical axis 30 is generally perpendicular to the mounting surface of the flexible printed circuit board 20 underneath the LEDs 26 and 27.

Both LEDs 26 and 27 may be identical electrically, mechanically, and optically (for example, being the same manufacturer part number). In one embodiment, the LEDs 26 and 27 will be designed to produce a red light of the same frequency (e.g., ~625 nm wave length) if they were biased for use as light emitters. Other colors may also be used, including infrared and other visible colors.

Figure 3:
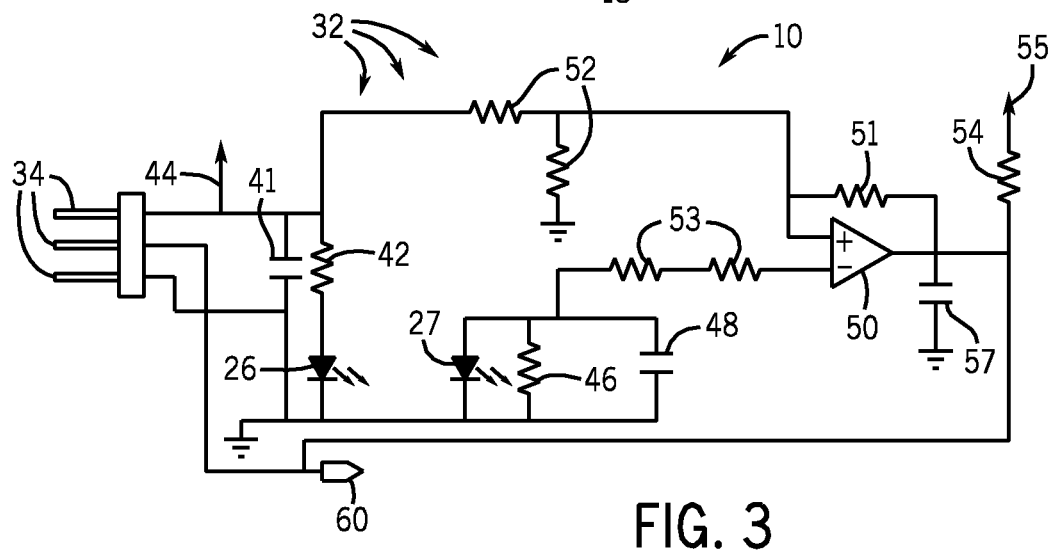
FIG. 3 is a schematic of a circuit used in the photo-interrupter of the present invention processing the signal from an LED light receiver to provide a switched output signal.

Referring now to FIG. 3, LED 26 may be given conventional LED biasing by means of a biasing resistor 42 communicating with a positive supply voltage 44 received through one of terminal pins 34. The biasing resistor 42 controls the current flow through the LED 26 from anode to cathode to control an emission of red light from the LED 26. As will be understood, for a given voltage provided to the terminal pins 34, the resistor 42 will define the current through the LED 26 and hence its illumination intensity. With slight changes in the supply voltage 44, the illumination intensity will also change.

The emitted light from the LED 26 is received by LED 27 whose conductivity is affected by the amount of received light. An electrical biasing of the LED 27 is provided by the inverting input of a comparator 50 which rests at a positive voltage with respect to ground. This positive voltage generates a current passing through resistors 53 to the anode of LED 27, the cathode of which is grounded.

Resistor 46 and capacitor 48 may be placed in parallel across the LED 26 to provide a low pass filter improving the signal quality developed by LED 26 by shunting to ground high frequency noise components and by limiting the switching speed of the photo-interrupter to reduce false triggering.

The comparator 50 compares the voltage at its inverting input, as will be determined by the light received by the LED 27, to a threshold voltage applied to the non-inverting input of comparator 50. This threshold voltage is established by a conventional resistor voltage divider 52 and will determine the switching point of the comparator 50 and thus the threshold sensitivity of the LED 27 to light. The voltage reference provided by the resistor divider 52 will also change with changes in the supply voltage 44, so as to offset the change in illumination intensity of the LED 26.

The threshold voltage may be flexibly adjusted appropriately by changing the relative values of the resistors of the resistor voltage divider 52 which spans the power and ground lines and provides the threshold voltage at the junction of its two resistors. In this way, the threshold voltage may be adjusted for different batches of LEDs 26 and 27 accommodating the fact that their light output and sensitivity may not be well characterized by the part number. In an alternative embodiment, the voltage threshold may be floating and based on the average signal level from LED 27, for example obtained from a low pass filter connected to the anode of diode 27 (not shown).

A resistor 51 may be attached between the output of the comparator 50 and the non-inverting input of the comparator 50 to provide for hysteresis reducing false triggering and promoting stability in the comparator 50. A suitable comparator may be the LM393 comparator, being a low power, low offset voltage comparator implemented as an integrated circuit providing a differential amplifier configuration, and commercially available from National Semiconductor of Santa Clara, Calif., as well as others. This comparator provides an open collector output and may operate with a single ended voltage supply of as little as 2 V.

A pull-up resistor 54 may attach between the output of the comparator 50 and the positive voltage source 55, the latter of which may be different from or the same as supply voltage 44 to provide a pull up voltage for the output of the comparator 50. By using the pull-up resistor 54 on an open collector output of comparator 50, the voltage of the voltage source 55 may be selected independently from the supply voltage 44 so that the output signal amplitude may be flexibly set by the device attached to the optical-interrupter 10 in the manner of a conventional optical-interrupter not having a comparator but using the collector of a phototransistor.

When light passing between the LEDs 26 and 27 is interrupted, the voltage at the negative input of comparator 50 will change, crossing the threshold established by the resistor voltage divider 52 and causing a switching of the output of the comparator 50, generating a square wave at an output terminal 60 connected to the output of the comparator having a frequency corresponding to a frequency of the interruption by the vane 40.

A filter capacitor 41 may be placed between the supply voltage 44 and ground to provide for improved voltage stability and the resistance to electrical noise. A nanofarad stabilizing capacitor 57 may be placed on the output of the comparator 50 for high frequency stability according to techniques known in the art.

Figure 4:
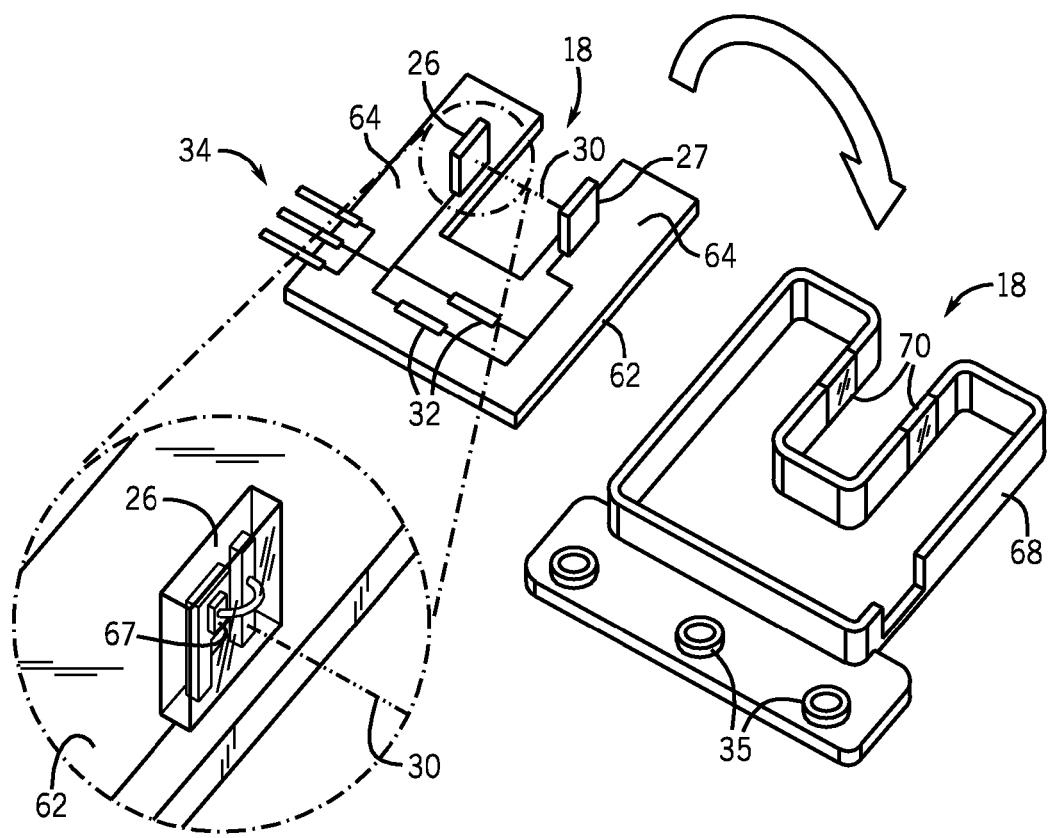
FIG. 4 is a perspective view in phantom of an alternative housing for the optical-interrupter.

Referring now to FIG. 4, in an alternative embodiment, the flexible printed circuit board 20 may be replaced with a conventional rigid printed circuit board 62 constructed, for example, of epoxy and glass fiber. This planar circuit board may nevertheless provide a slot 18 by being cut into a U-shape having parallel extending legs 64 flanking the slot 18. In this case, the LEDs 26 and 27 may be side-looking LEDs which emit and receive light along axis 30 generally parallel to the surface of the printed circuit board 62. This is in contrast to the embodiment of FIG. 1 in which the optical axis 30 is perpendicular to the surface of the flexible printed circuit board 20.

Per conventional LED design, the LEDs 26 and 27 may include an internal PN junction 67 having an N-channel material mounted directly to an opaque cathode conductor to emit light through the P-junction material along optical axis 30.

Terminal pins 34 may be mounted on the printed circuit board 62 to connect by traces to the other components 32. A corresponding U-shaped housing 68 may be constructed for receiving the printed circuit board 62 and the mounted components 32 and may provide for transparent windows 70 on portions of the housing 68 that lie along the optical axis 30 across the slot 18. As before, mounting holes 35 may be provided for mounting the housing 68 and the assembled printed circuit board 62 to a device. The printed circuit board 62 may be held within the housing 68 by a cover (not shown) enclosing the housing 68 about the printed circuit board 62.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

What is claimed is:

1. A photosensor-photodetector assembly comprising:
   a support defining an unobstructed light path through a gap from a first to a second position;
   electrical terminals adapted to receive a direct current supply voltage and ground voltage for the photosensor-photodetector assembly and to provide an electrical output from the photosensor-photodetector assembly;
   a solid-state light transmitter and solid-state light receiver attached to the support in the first and second positions so that light from the solid-state light transmitter may be received by the solid-state light receiver, the gap sized to permit an optical blocking element to pass into and out of the gap to block the light from the solid-state light transmitter to the solid-state light receiver;
   a biasing circuit providing an electrical bias to the solid-state light transmitter and an electrical bias to the solid-state light receiver, when a direct current supply voltage and ground voltage are received by the electrical terminals;
   detection circuitry including a threshold detector connected to the solid-state light receiver to compare a signal from the solid-state light receiver to a threshold signal to provide the electrical output; wherein the threshold signal varies with the supply voltage to compensate for changes in the illumination of the solid-state light transmitter with changes in supply voltage; and
   wherein the solid-state light transmitter and solid-state light receiver are both light emitting diodes; and
   wherein a substantially continuous electrical bias that is a substantially proportional function of the supply voltage is applied to the solid-state light transmitter.

2. The photosensor-photodetector assembly of claim 1 wherein the light emitting diodes are selected to produce light of substantially identical light frequency when operated as light emitters.

3. The photosensor-photodetector assembly of claim 2 wherein the light emitting diodes emit visible light.

4. The photosensor-photodetector assembly of claim 3 wherein the light emitting diodes emit red light.

5. The photosensor-photodetector assembly of claim 2 wherein the light emitting diodes are substantially identical.

6. The photosensor-photodetector assembly of claim 1 wherein the light emitting diodes are constructed using direct band gap semiconductor materials forming a PN junction held within a housing as supported on an opaque substrate having a light transparent portion permitting light to pass along an axis to and from the PN junction.

7. The photosensor-photodetector assembly of claim 6 wherein an N-doped semiconductor of the PN junction abuts the opaque substrate.

8. The photosensor-photodetector assembly of claim 1 wherein the first and second positions are separated by less than three inches.

9. The photosensor-photodetector assembly of claim 1 wherein the detection circuitry connected to the solid-state light receiver provides a two-state electrical output having a first state when the solid-state light receiver receives a first intensity of light provided by unobstructed light from the solid-state light transmitter as biased by the biasing circuitry and having a second state when the solid-state light receiver receives a second intensity of light less than the first intensity of light.

10. The photosensor-photodetector assembly of claim 9 wherein the detection circuitry includes a comparator and wherein the comparator receives at one input an electrical signal from the solid-state light receiver having first and second values for the first and second intensities of light and the comparator receives at another input the threshold signal having a value between the first and second values.

11. The photosensor-photodetector assembly of claim 10 wherein the threshold signal and the electrical bias of the biasing circuit are each a function of a supply voltage to the photosensor-photodetector assembly.

12. The photosensor-photodetector assembly of claim 11 wherein the comparator is an integrated circuit differential amplifier.

13. The photosensor-photodetector assembly of claim 11 wherein the comparator provides an open collector output.

14. The photosensor-photodetector assembly of claim 1 wherein the support is a flexible printed circuit board held within a housing bending the flexible printed circuit board into a U-shape with the first and second positions located at ends of the U-shape.

15. The photosensor-photodetector assembly of claim 1 wherein the support is a rigid planar printed circuit board cut into a U-shape with the first and second positions located at ends of the U-shape.

16. The photosensor-photodetector assembly of claim 15 wherein the light emitting diodes provide a maximum light emitting direction parallel to a mounting surface of the light emitting diode abutting the support surface.

17. A photosensor-photodetector assembly comprising:
a movable light opaque vane;
a housing defining a light path through an open space from a first to a second position, the open space sized to permit movement of the vane into the open space in a first state and out of the open space in a second state;
electrical terminals adapted to receive a direct current supply voltage and ground voltage for the photosensor-photodetector assembly and to provide an electrical output from the photosensor-photodetector assembly;
a light source and light detector fixed with respect to the housing at respective first and second positions so that light from the light source may be received by the light receiver across the open space in the first state and blocked from the light receiver in the second state;
a biasing circuit providing an electrical bias to the light source and an electrical bias to the light detector, when a direct current supply voltage and ground voltage are received by the electrical terminals;
detection circuitry including a threshold detector connected to the light source to compare a signal from the light detector to a threshold signal to provide the electrical output; wherein the threshold signal varies with the supply voltage to compensate for changes in the illumination of the solid-state light transmitter with changes in supply voltage; and
wherein both the light source and light detector are light emitting diodes designed to emit light of a same frequency when biased for light emission, the light emitting diodes having direct band open space semiconductor materials forming a PN junction held within a case and supported on an opaque substrate, the case having a non-opaque portion permitting light to pass into and out of the housing; and
wherein a substantially continuous electrical bias that is a substantially proportional function of the supply voltage is applied to the solid-state light source.

18. The photosensor-photodetector assembly of claim 17 wherein an N-doped semiconductor of the PN junction abuts the opaque substrate over an entire face of the N-doped semiconductor.

19. The photosensor-photodetector assembly of claim 1 wherein the biasing circuit includes a filter capacitor stabilizing its output voltage.

* * * * *